(12) United States Patent
Kim

(10) Patent No.: US 9,843,306 B2
(45) Date of Patent: Dec. 12, 2017

(54) TUNER CIRCUIT

(71) Applicant: LG INNOTEK CO., LTD., Seoul (KR)

(72) Inventor: Young Keun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/019,549

(22) Filed: Feb. 9, 2016

(65) Prior Publication Data

US 2016/0254799 A1 Sep. 1, 2016

(30) Foreign Application Priority Data

Feb. 27, 2015 (KR) .................. 10-2015-0027983

(51) Int. Cl.
*H04B 7/08* (2006.01)
*H03J 5/24* (2006.01)

(52) U.S. Cl.
CPC .................................. *H03J 5/244* (2013.01)

(58) Field of Classification Search
CPC ..... H04B 7/0868; H04B 1/0475; H03F 3/195; H03F 3/245
USPC ....... 370/275, 276, 278, 297; 455/33.3, 121, 455/575; 327/551–559
See application file for complete search history.

(56) References Cited

U.S. PATENT DOCUMENTS

| 5,642,083 | A | * | 6/1997 | Kato | H03K 17/76 333/103 |
| 6,011,450 | A | * | 1/2000 | Miya | H01P 1/15 333/103 |
| 6,125,271 | A | * | 9/2000 | Rowland, Jr. | H03D 7/00 329/308 |
| 7,286,808 | B2 | * | 10/2007 | Sugiyama | H04H 40/18 348/725 |
| 7,440,491 | B2 | * | 10/2008 | Balakrishnan | H04B 1/71635 341/122 |
| 8,644,197 | B2 | * | 2/2014 | Lee | H01Q 9/40 340/572.7 |

* cited by examiner

*Primary Examiner* — Dinh T Le
(74) *Attorney, Agent, or Firm* — LRK Patent Law Firm

(57) ABSTRACT

A tuner circuit includes a DC (Direct Current) cut-off unit configured to cut off a DC component in a signal received from an antenna, a switching unit configured to transmit the signal by being turned on when a bias voltage is applied, a high pass filter unit configured to pass only a high frequency component in a signal having passed the switching unit, and a low noise amplifier configured to output a signal having passed a high frequency filter by amplifying the signal.

6 Claims, 3 Drawing Sheets

TUNER CIRCUIT

CROSS-REFERENCE TO RELATED APPLICATIONS

The present application is based on, and claims priority from the Korean Patent Application Number 10-2015-0027983 filed on Feb. 27, 2015, the entire contents of which are incorporated by reference herein in their entirety.

BACKGROUND OF THE INVENTION

1. Field of the Invention

Exemplary embodiments of the present disclosure generally relate to a tuner circuit

2. Description of Related Art

In general, a tuner is a device receiving a broadcasting channel by selecting a desired broadcasting channel from a high frequency signal received from an antenna. The tuner receives the broadcasting signal by selecting a VHF band ranging several MHz to several hundred MHz and a UHF band ranging several hundred MHz to several GHz in reception bands, where the VHF band is received by being discretely selected as VHF-L and VHF-H bands.

However, a conventional tuner circuit suffers from disadvantages of a high frequency signal received to an antenna (ANT) being leaked to a ground while a power is cut off. Furthermore, in case of television, the television must pass an EN55030 S4 test, where the S4 test is difficult in impedance matching and S4 is rendered weak due to generation of signal leakage because the test must be implemented while the television power is off. Particularly, it is difficult recently to reinforce the ground due to an external cable and ground being separated in order to prevent television fire.

SUMMARY

The present disclosure is provided to cope with the abovementioned problems/disadvantages and it is an object of the present disclosure to provide a tuner circuit configured to prevent a high frequency signal received by an antenna from flowing to ground while a power is cut off.

In a general aspect of the present disclosure, there is provided a tuner circuit, the tuner circuit comprising: a switch configured to cut off a signal inputted from an antenna by being turned on/off in response to a bias voltage; a high pass filter configured to pass only a high frequency component in a signal having passed the switching unit; and a low noise amplifier configured to output a signal having passed a high frequency filter by amplifying the signal.

Preferably, but not necessarily, the switch may include a diode.

Preferably, but not necessarily, the switch may cut off transmission of the signal received from the antenna to the high pass filter by being turned off when the bias voltage is not applied.

Preferably, but not necessarily, the diode may be arranged in a forward direction or a reverse direction.

Preferably, but not necessarily, the switch may include a diode whose cathode is arranged at an antenna side, and anode is positioned at a high pass filter unit, a first resistor connected in parallel to the cathode, and a second resistor connected in parallel to the anode.

Preferably, but not necessarily, the switch may be configured in a manner such that the bias voltage is applied to the second resistor.

Preferably, but not necessarily, the switch may include a diode whose anode is arranged at an antenna side, and cathode is arranged at a high pass filter, a third resistor connected in parallel to the anode.

Preferably, but not necessarily, the switching unit may be configured in a manner such that a bias voltage is applied to the third resistor.

In another general aspect of the present disclosure, there is provided a tuner circuit, the tuner circuit comprising: a DC (Direct Current) cut-off unit configured to cut off a DC component in a signal received from an antenna; a switch configured to transmit the signal by being turned on when a bias voltage is applied; a high pass filter configured to pass only a high frequency component in a signal having passed the switching unit; and a low noise amplifier configured to output a signal having passed a high frequency filter by amplifying the signal.

Preferably, but not necessarily, the switch may include a diode.

Preferably, but not necessarily, the switch may cut off transmission of the signal received from the antenna to the high pass filter unit by being turned off when the bias voltage is not applied.

Preferably, but not necessarily, the diode may be arranged in a forward direction or a reverse direction.

Preferably, but not necessarily, the switch may be configured in a manner such that a switching element is serially connected between the DC cut off unit and the high pass filter unit, and a first resistance element and a second resistance element are connected in parallel across the switching element.

Preferably, but not necessarily, the switching element may be arranged in a reverse direction, and the second resistance element may be applied with the bias voltage.

Preferably, but not necessarily, the switch may be configured in a manner such that a switching element is serially connected between the DC cut off unit and the high pass filter unit, and the switch further includes a third resistance element connected in parallel between the DC cut off unit and the switching element.

Preferably, but not necessarily, the switching element may be arranged in a forward direction and the third resistance element may be applied with a bias voltage

DETAILED DESCRIPTION

The present inventive concept may, however, be embodied in many different forms and should not be construed as limited to the exemplary embodiments set forth herein. Rather, the described aspect is intended to embrace all such alterations, modifications, variations, and equivalents that fall within the scope and novel idea of the present disclosure.

Hereinafter, a tuner circuit according to an exemplary embodiment of the present disclosure will be described in detail with reference to the accompanying drawing.

Figure 1:
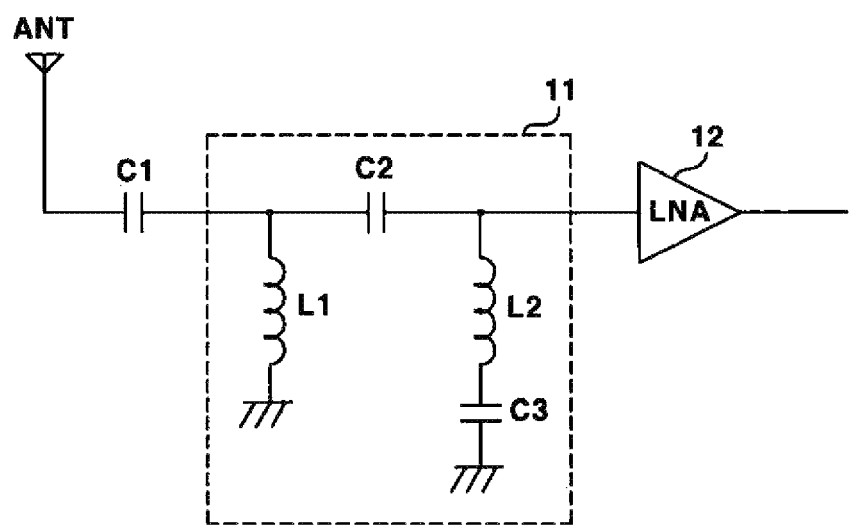
FIG. 1 is a circuit diagram illustrating a tuner circuit.

FIG. 1 illustrates a tuner, and the tuner may include a DC cut off capacitor (C1), a high frequency filter (11) and a low noise amplifier (12). A DC component in a high frequency signal (RF) inputted through an antenna (ANT) may be cut off by the DC cut off capacitor (C1) according to the configuration thus mentioned, and a low frequency component in the high frequency signal having passed the DC cut off capacitor (C1) may be filtered by the high frequency filter (11) and only high frequency component may be outputted by being inputted to the low noise amplifier (12).

In the circuit configuration thus discussed, there may be a problem of a high frequency signal inputted through the antenna (ANT) being leaked while a television is turned off, and therefore, there is a need to solve the problem.

Figure 2:
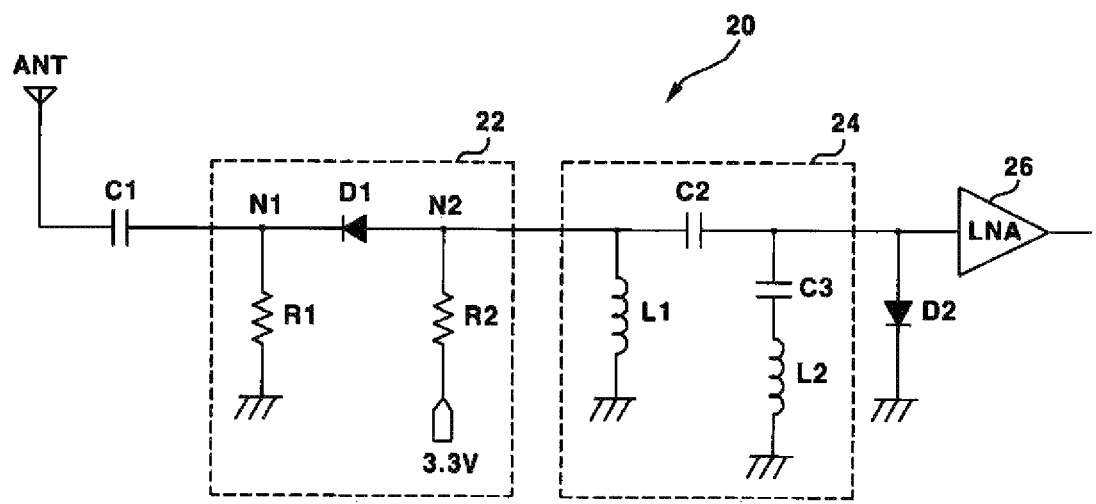
FIG. 2 is a circuit diagram illustrating a tuner circuit according to an exemplary embodiment of the present disclosure.

FIG. 2 is a circuit diagram illustrating a tuner circuit according to an exemplary embodiment of the present disclosure.

Referring to FIG. 2, a tuner circuit (20) according to an exemplary embodiment of the present disclosure may include a switching unit (22), a high pass filter unit (24) and a low noise amplifier (26). A DC cut off capacitor (C1) may be arranged between the antenna (ANT) and the switching unit (22), and an ESD (Electrostatic Discharge, D2) may be arranged between the high pass filter unit (24) and the low noise amplifier (26). However, it should be noted that FIG. 2 briefly illustrates only an input terminal of the tuner circuit and therefore, it should be apparent to the skilled in the art that other elements may be included, in addition to the above configuration.

The DC cut off capacitor (C1) may cut off a DC component in a high frequency signal (RF, Radio Frequency) received from the antenna (ANT). The switching unit (22) functions to cut off transmission of a signal having passed the DC cut off capacitor (C1) to the high pass filter unit (24). The switching unit (22) may include a diode (D1), a first resistor (R1) and a second resistor (R2). At this time, the diode (D1) may be connected to the DC cut off capacitor (C1) in a reverse direction. That is, a cathode direction of the diode (D1) may be arranged to face a direction of the DC cut off capacitor (C1).

The first resistor (R1) may be connected in parallel to a cathode side node (N1) of the diode (D1), and the second resistor (R2) may be connected in parallel to an anode side node (N2). Furthermore, one side of the first resistor (R1) may be grounded and one side of the second resistor (R2) may be connected to a bias voltage (V), such that when a bias voltage is applied, the diode (D1) may be turned on, and when a bias voltage is not applied, the diode (D1) may be turned off to cut off an antenna signal. The bias voltage may be 3.3V.

When a bias voltage is applied in the above configuration, that is, when a television is turned on, the diode (D1) may be turned on to allow a high frequency signal inputted to the antenna to be transmitted to the high pass filter unit (24). However, when a bias voltage is not applied in the above configuration, that is, when a television is turned off, the diode (D1) may be turned off to prevent a high frequency signal inputted to the antenna from being transmitted to the high pass filter unit (24), whereby a high frequency signal is resultantly prevented from flowing to the ground.

The high pass filter unit (24) may filter a low frequency component in the signal having passed the switching unit (22) and pass only a high frequency component. The high pass filter unit (24) may generally attenuate a signal less than 50 MHz and pass a signal of high frequency more than 50 MHz. As illustrated in FIG. 2, the high pass filter unit (24) is configured in a manner such that a capacitor (C2) is connected to the switching unit (22), and an inductor (L1) and serially connected capacitor (C3) and an inductor (L2) are connected in parallel across the capacitor.

The low noise amplifier (26) may amplify a high frequency component having passed the high pass filter unit (24) and output the high frequency component having passed the high pass filter unit (24). An ESD (Electrostatic Discharge), as an element for protecting a circuit, may be arranged between the high pass filter unit (24) and the low noise amplifier (26) and may protect the circuit by discharging the static electricity while being grounded at one side of the diode (D2) as illustrated in FIG. 2.

Hereinafter, an operation of tuner circuit (20) will be described in detail.

When a high frequency signal is inputted to an antenna (ANT) of the tuner circuit (20), a DC component is cut off by the DC cut off capacitor (C1) and only a signal of AC component is inputted to the switching unit (22). The switching unit (22) is turned on when a bias voltage is applied to pass a high frequency signal received by the antenna and is turned off when a bias voltage is not applied to prevent the high frequency signal received by the antenna from being transmitted. The signal received by the antenna, when the switching unit (22) is turned on, is inputted to the high pass filter unit (24) to weaken a low frequency component and to allow only the high frequency component to be inputted to the low noise amplifier (26), and to be outputted by being amplified.

When a television is turned off by the configuration thus mentioned, the switching unit (22) is turned off to prevent a signal received by the antenna from being leaked to the ground.

Figure 3:
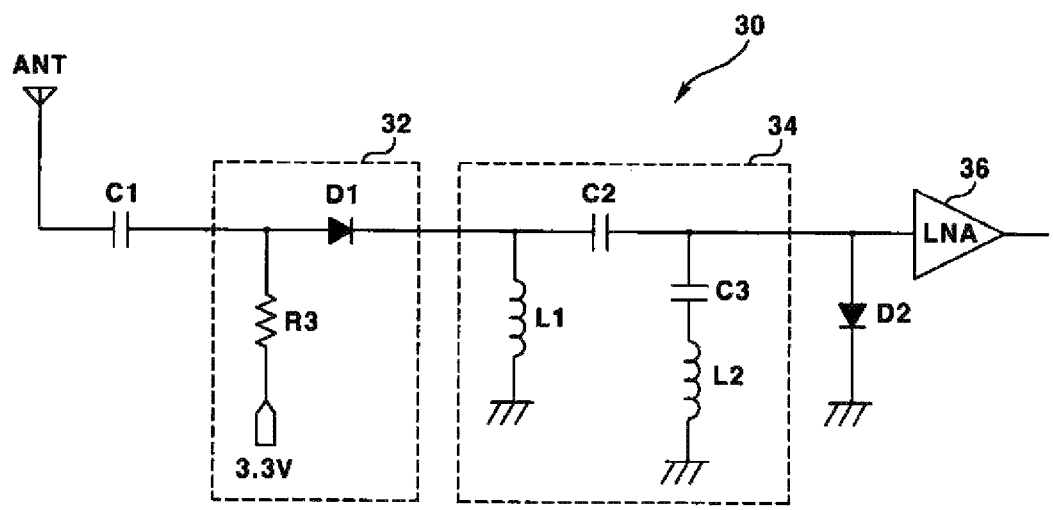
FIG. 3 is a circuit diagram illustrating a tuner circuit according to another exemplary embodiment of the present disclosure.

FIG. 3 is a circuit diagram illustrating a tuner circuit (30) according to another exemplary embodiment of the present disclosure.

Referring to FIG. 3, the tuner circuit (30) according to another exemplary embodiment of the present disclosure may include a switching unit (32), a high pass filter unit (34) and a low noise amplifier (36).

A DC cut off capacitor (C1) may be arranged between an antenna (ANT) and the switching unit (32), and an ESD (Electrostatic Discharge, D2) may be arranged between the high pass filter unit (34) and the low noise amplifier (36). The DC cut off capacitor (C1) may cut off a DC component in a high frequency signal (RF, Radio Frequency) received from the antenna (ANT). The switching unit (32) functions to cut off transmission of a signal having passed the DC cut off capacitor (C1) to the high pass filter unit (34). The switching unit (32) may include a diode (D1), and a third resistor (R3). At this time, the diode (D1) may be connected to the DC cut off capacitor (C1) in a forward direction. That is, an anode direction of the diode (D1) may be arranged to face a direction of the DC cut off capacitor (C1).

The third resistor (R3) may be connected in parallel to a cathode side node of the diode (D1), and one side of the third resistor (R3) may be connected in parallel to a cathode sided node of the diode (D1) and one side of the third resistor (R3) may be connected to a bias voltage (V), such that when a bias voltage is applied, the diode (D1) may be turned on to pass a high frequency signal inputted to the antenna, and when a bias voltage is not applied, the diode (D1) may be turned off to prevent a signal inputted to the antenna from being transmitted. The bias voltage may be 3.3V.

When a bias voltage is applied in the above configuration, that is, when a television is turned on, the diode (D1) may be turned on to allow an antenna signal to be transmitted to the high pass filter unit (34). However, when a bias voltage is not applied in the above configuration, that is, when a television is turned off, the diode (D1) may be turned off to prevent an antenna signal from being transmitted to the high pass filter unit (34), whereby a high frequency signal received by the antenna is resultantly prevented from flowing to the ground.

The high pass filter unit (34) may filter a low frequency component in the signal having passed the switching unit (32) and pass only a high frequency component. The high pass filter unit (34) may generally attenuate a signal less than 50 MHz and pass a signal of high frequency more than 50 MHz. As illustrated in FIG. 3, the high pass filter unit (34) is configured in a manner such that a capacitor (C2) is connected to the switching unit (32), and an inductor (L1) and serially connected capacitor (C3) and an inductor (L2) are connected in parallel across the capacitor.

The low noise amplifier (36) may amplify a high frequency component having passed the high pass filter unit (34) and output the high frequency component having passed the high pass filter unit (34)

An ESD (Electrostatic Discharge), as an element for protecting a circuit, may be arranged between the high pass filter unit (34) and the low noise amplifier (36) and may protect the circuit by discharging the static electricity while being grounded at one side of the diode (D2) as illustrated in FIG. 3.

The present disclosure has an advantageous effect in that leakage of antenna signal can be prevented free from using an additional part for antenna ground reinforcement of television, and defect rate caused by deviation during mass production can be reduced by securement of a sufficient margin.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments within an equivalent scope. Therefore, the technical scope of the rights for the present disclosure shall be decided by rational interpretation of the appended claims and equivalents thereof.

What is claimed is:

1. A tuner circuit included in a television, comprising:
    a switch including a diode and resistors and configured to be turned on/off in response to a bias voltage to cut off a signal inputted from an antenna, wherein the bias voltage starts to be applied when the television is turned on by a user;
    a high pass filter configured to pass only a high frequency component in a signal having passed the switch; and
    a low noise amplifier configured to amplify and output a signal having passed the high pass filter,
    wherein the diode is arranged in such a manner that a cathode of the diode faces the antenna and an anode of the diode faces the high pass filter, one of the resistors is connected between the cathode of the diode and a ground, and another of the resistors is connected between the anode of the diode and the bias voltage,
    wherein when the television is turned off to allow the bias voltage to be not applied, the diode is turned off to cut off transmission of the signal received from the antenna to the high pass filter, whereby the signal is prevented from flowing to the ground, and
    wherein when the television is turned on to allow the bias voltage to be applied, the diode is turned on to transmit the signal received from the antenna to the high pass filter.

2. The tuner circuit of claim 1, wherein the bias voltage is applied to the other resistor.

3. A tuner circuit included in a television, comprising:
    a switch including a diode and a resistor and configured to be turned on/off in response to a bias voltage to cut off a signal inputted from an antenna, wherein the bias voltage starts to be applied when the television is turned on by a user;
    a high pass filter configured to pass only a high frequency component in a signal having passed the switch; and
    a low noise amplifier configured to amplify and output a signal having passed the high pass filter,
    wherein the diode is arranged in such a manner that an anode of the diode faces the antenna and a cathode of the diode faces the high pass filter, and the resistor is connected between the anode of the diode and the bias voltage,
    wherein when the television is turned off to allow the bias voltage to be not applied, the diode is turned off to cut off transmission of the signal received from the antenna to the high pass filter, whereby the signal is prevented from flowing to the ground, and
    wherein when the television is turned on to allow the bias voltage to be applied, the diode is turned on to transmit the signal received from the antenna to the high pass filter.

4. The tuner circuit of claim 3, wherein the switch is configured in such a manner that the bias voltage is applied to the resistor.

5. A tuner circuit included in a television, comprising:
    a DC (Direct Current) cut-off unit configured to cut off a DC component in a signal received from an antenna;
    a switch including a switching element and resistors and configured to be turned on/off in response to a bias voltage to transmit the signal, wherein the bias voltage starts to be applied when the television is turned on by a user;
    a high pass filter configured to pass only a high frequency component in a signal having passed the switch; and
    a low noise amplifier configured to amplify and output a signal having passed the high pass filter,
    wherein the switch is configured in such a manner that, the switching element is serially connected between the DC cut-off unit and the high pass filter, one of the resistors is connected between the DC cut-off unit and the switching element, and another of the resistors is connected between the switching element and the high pass filter,
    wherein when the television is turned off to allow the bias voltage to be not applied, the switching element is turned off to cut off transmission of the signal received from the antenna to the high pass filter, whereby the signal is prevented from flowing to the ground, and
    wherein when the television is turned on to allow the bias voltage to be applied, the switching element is turned on to transmit the signal received from the antenna to the high pass filter.

6. The tuner circuit of claim 5, wherein the switching element is arranged in a reverse direction and the other resistor is applied with the bias voltage.

* * * * *